(12) United States Patent
Lee et al.

(10) Patent No.: US 8,536,781 B2
(45) Date of Patent: Sep. 17, 2013

(54) BLACK ORGANIC LIGHT-EMITTING DIODE DEVICE

(75) Inventors: Yong-Hee Lee, Daejeon (KR); Sang-Hwan Cho, Daejeon (KR); Young Rag Do, Seoul (KR)

(73) Assignee: Korea Advanced Institute of Science and Technology (KR)

( * ) Notice: Subject to any disclaimer, the term of this patent is extended or adjusted under 35 U.S.C. 154(b) by 0 days.

(21) Appl. No.: 13/465,121

(22) Filed: May 7, 2012

(65) Prior Publication Data

US 2012/0280612 A1 Nov. 8, 2012

Related U.S. Application Data

(63) Continuation of application No. PCT/KR2010/005060, filed on Jul. 30, 2010.

(30) Foreign Application Priority Data

Nov. 5, 2009 (KR) .................. 10-2009-0106496

(51) Int. Cl.
*H01L 51/52* (2006.01)
(52) U.S. Cl.
USPC .............................................. 313/504
(58) Field of Classification Search
USPC .................................. 313/498–512
See application file for complete search history.

(56) References Cited

U.S. PATENT DOCUMENTS 7,495,385 B2 * 2/2009 Lee et al. ............... 313/504
2010/0231124 A1 * 9/2010 Song ....................... 313/504

FOREIGN PATENT DOCUMENTS

| JP | 2006-156396 A | 6/2006 |
|---|---|---|
| JP | 2007-115638 A | 5/2007 |
| JP | 2008-021633 A | 1/2008 |
| JP | 2008-251217 A | 10/2008 |

OTHER PUBLICATIONS

PCT Search Report (PCT/KR2010/005060).

* cited by examiner

*Primary Examiner* — Donald Raleigh
(74) *Attorney, Agent, or Firm* — Park & Associates IP Law, P.C.

(57) ABSTRACT

The present invention relates to a black organic light-emitting diode that implements a resonant absorbing configuration, the black organic light-emitting diode comprising: a glass substrate; a first metal layer formed on the glass substrate; a first electrode formed on the first metal layer; an organic light-emitting layer formed on the first electrode; a second electrode formed on the organic light-emitting layer, opposite the first electrode; a first interlayer formed on the second electrode; a second metal layer formed on the first interlayer; and a second interlayer formed on the second metal layer, wherein by controlling the thickness of the first interlayer and the second interlayer, external light reflected by the first metal layer and the second electrode destructively interferes with light reflected by the second metal layer.

10 Claims, 14 Drawing Sheets

BLACK ORGANIC LIGHT-EMITTING DIODE DEVICE

REFERENCE TO RELATED APPLICATIONS

This is a continuation of pending International Patent Application PCT/KR2010/005060 filed on Jul. 30, 2010, which designates the United States and claims priority of Korean Patent Application No. 10-2009-0106496 filed on Nov. 5, 2009, the entire contents of which are incorporated herein by reference.

FIELD OF THE INVENTION

The present invention relates to a black organic light-emitting diode device using a resonant absorbing configuration with improved contrast and photoefficiency.

BACKGROUND OF THE INVENTION

Recently, displays are being replaced with portable thin flat panel displays. Among the flat panel displays, an organic light-emitting diode (OLED) display which spontaneously emits light has a wide viewing angle, high contrast and fast response rate and is thus receiving attention as a next-generation display, and is also advantageous because of superior luminance, driving voltage and response rate and a wide color reproduction range.

Such flat panel displays have recently been manufactured to be light and thin and are thus portable and usable outdoors. In the case where a user sees an image outdoors using a flat panel display, sunlight is reflected from the display undesirably lowering contrast and visibility. Particularly, the case of an organic light-emitting display is problematic because such reflection from a metal reflective film is much more severe.

To solve this problem, a circular polarizer is typically disposed on one surface of an organic light-emitting display. Although the circular polarizer has a transmittance of about 40-45% and thus advantageously may reduce reflection of external light, light emitted from the inside of the device may be undesirably decreased. Furthermore, a typical circular polarizer consists of a linear polarizer and a 90° phase retarder, and has a total thickness of about 0.3 mm.

The case where this polarizer is applied to an ultrathin display which is the most recent trend is problematic because it may increase the thickness of the display and is also disposed outside the device thus requiring an additional process and making it difficult to form an integrated single device. For this reason, research into substitutes for the circular polarizer is currently ongoing.

According to recent studies (U.S. Pat. No. 5,049,780, U.S. Pat. No. 6,411,019), techniques for reducing reflection of external light using an optical interference filter in lieu of the circular polarizer have been devised. The optical interference filter using metal-dielectric thin layers enables light waves reflected from respective metal layers to disappear under conditions of phases therebetween being set to 180° by adjusting the thickness of dielectrics. In particular, when such thin layers are disposed on a bottom metal electrode layer of the organic light-emitting device, they play a role in reducing the reflection of external light from the metal electrode.

In addition, a method of coating a reflective electrode with a material able to absorb light has been exemplified (WO 00/25028, Optic Express V13. p. 1406 (2005), Thin Solid Films V379. p. 195 (2000)). In this method, examples of the material able to absorb light may include graphite, a black polymer, etc.

However, because the conventional configurations as above may decrease the reflectance of the metal electrode positioned under the light-emitting layer, light emitted downwards from the light-emitting layer is not reflected but is reduced, undesirably decreasing photoefficiency. Also, as the reflectance of the bottom metal layer positioned adjacent to the light-emitting layer decreases, a microcavity phenomenon may decrease undesirably lowering luminance. Thus, causes of lowering photoefficiency, which are the largest problems of the circular polarizer, are not removed.

To overcome such problems, recent research (U.S. Pat. No. 6,876,018) has proposed a configuration for reducing external light using destructive interference with the top metal layer without reducing the reflectance of the bottom metal electrode. In this case, however, to satisfy destructive interference conditions between the bottom metal electrode and the top metal layer, the thickness of an organic layer or a transparent electrode layer which is disposed between these two metal layers should be adjusted. When the thickness of the electrode layer and the light-emitting layer changes in this way, light emission efficiency and electrical properties may vary. Hence, the above technique is difficult to apply to actual devices because of influences on the electrical properties.

SUMMARY OF THE INVENTION

Accordingly, the present invention has been made keeping in mind the above problems occurring in the related art, and an object of the present invention is to provide a black organic light-emitting diode device, in which an organic light-emitting diode is simply configured by removing a circular polarizer used conventionally to absorb external light to increase contrast of the device, and which may solve problems of high process costs and low photoefficiency, which are mainly caused by the use of the circular polarizer.

Another object of the present invention is to provide a black organic light-emitting diode device, which does not affect light emission efficiency because the reflectance of a bottom metal layer positioned adjacent to a light-emitting layer is not decreased, and in which additional metal-dielectric thin layers are inserted outside the device without the need to adjust the thickness of an organic layer and a transparent electrode layer and are controlled to form a resonant absorbing configuration, so that the reflection of external light may be reduced and photoefficiency may be improved without any influences on the electrical properties of the device.

In order to accomplish the above objects, an aspect of the present invention provides a black organic light-emitting diode device, comprising a glass substrate, a first metal layer formed on the glass substrate, a first electrode formed on the first metal layer, an organic light-emitting layer formed on the first electrode, a second electrode formed on the organic light-emitting layer so as to face the first electrode, a first interlayer formed on the second electrode, a second metal layer formed on the first interlayer, and a second interlayer formed on the second metal layer, wherein thicknesses of the first interlayer and the second interlayer are adjusted so that external light reflected from the first metal layer and the second electrode destructively interferes with light reflected from the second metal layer.

In this aspect, part of the external light reflected from the first metal layer and the second electrode, which does not destructively interfere with light reflected from the second metal layer, may be absorbed by the second metal layer.

In this aspect, the first metal layer may improve electrical resistance of the first electrode, and a material of the first metal layer may be any one selected from the group consisting of Ag, Al, Mg, Cr, Ti, Ni, W, Au, Ta, Cu, Co, Fe, Mo and Pt, or alloys thereof.

In this aspect, the second metal layer may be provided in the form of a thin metal layer, and a material of the second metal layer may be any one selected from the group consisting of Cr, Ti, Mo, Co, Ni, W, Al, Ag, Au, Cu, Fe, Mg and Pt, or alloys thereof.

In this aspect, the first electrode may be a transmissive electrode and may form an anode, and a material of the first electrode may comprise a transparent conductive oxide such as ITO (Indium Tin Oxide) or IZO (Indium Zinc Oxide). However, instead of the transmissive electrode, the use of a semi-transmissive electrode coated with thin metal is possible.

In this aspect, the second electrode may be a semi-transparent metal layer and may form a cathode, and a material of the second electrode may be any one selected from the group consisting of Ag, Al, Mg, Cr, Ti, Ni, W, Au, Ta, Cu, Co, Fe, Mo and Pt, or alloys thereof.

In this aspect, the first interlayer may be a dielectric layer which enables a relative phase between light reflected from the second electrode and light reflected from the second metal layer to be adjusted to 120~240°, and a material of the first interlayer may be any one selected from the group consisting of $SiOx$ ($x \geq 1$), $SiNx$ ($x \geq 1$), $MgF_2$, $CaF_2$, $Al_2O_3$, $SnO_2$, ITO, IZO, ZnO, $Ta_2O_5$, $Nb_2O_5$, $HfO_2$, $TiO_2$ and $In_2O_3$.

As such, the reason why the relative phase between light reflected from the second electrode and light reflected from the second metal layer is limited to the range of about 120~240° is that, even when the relative phase is not exactly 180°, it can be experimentally seen that destructive interference may occur in the range of about 120~240° near 180°, and preferably such destructive interference may efficiently take place in the range of 150~210°, and very preferably at 180°.

The second interlayer may be a dielectric layer which compensates for a case where the relative phase adjusted by the first interlayer falls outside 180°, and a material of the second interlayer may be any one selected from the group consisting of $SiOx$ ($x \geq 1$), $SiNx$ ($x \geq 1$), $MgF_2$, $CaF_2$, $Al_2O_3$, $SnO_2$, ITO, IZO, ZnO, $Ta_2O_5$, $Nb_2O_5$, $HfO_2$, $TiO_2$ and $In_2O_3$.

Another aspect of the present invention provides a black organic light-emitting diode device, comprising a glass substrate, a first metal layer formed on the glass substrate, a first electrode formed on the first metal layer, an organic light-emitting layer formed on the first electrode, a second electrode formed on the organic light-emitting layer so as to face the first electrode, and a plurality of metal-dielectric thin layers formed on the second electrode, wherein the metal-dielectric thin layers comprise a dielectric layer and a semi-transmissive metal layer and cause external light reflected from the first metal layer and the second electrode to destructively interfere.

In this aspect, part of the external light reflected from the first metal layer and the second electrode, which does not destructively interfere by the metal-dielectric thin layers, may be absorbed by the semi-transmissive metal layer.

In this aspect, the first metal layer may improve electrical resistance of the first electrode, and a material of the first metal layer may be any one selected from the group consisting of Ag, Al, Mg, Cr, Ti, Ni, W, Au, Ta, Cu, Co, Fe, Mo and Pt, or alloys thereof.

In this aspect, the first electrode may be a transmissive electrode and may form an anode, and a material of the first electrode may comprise a transparent conductive oxide such as ITO (Indium Tin Oxide) or IZO (Indium Zinc Oxide). However, instead of the transmissive electrode, the use of a semi-transmissive electrode coated with thin metal is possible.

The second electrode may be a semi-transmissive metal layer and may form a cathode, and a material of the second electrode may be any one selected from the group consisting of Ag, Al, Mg, Cr, Ti, Ni, W, Au, Ta, Cu, Co, Fe, Mo and Pt, or an alloys thereof.

The metal-dielectric thin layers may comprise the dielectric layer and the semi-transmissive metal layer, and a material of the dielectric layer may be any one selected from the group consisting of $SiOx$ ($x \geq 1$), $SiNx$ ($x \geq 1$), $MgF_2$, $CaF_2$, $Al_2O_3$, $SnO_2$, ITO, IZO, ZnO, $Ta_2O_5$, $Nb_2O_5$, $HfO_2$, $TiO_2$ and $In_2O_3$, and a material of the semi-transmissive metal layer may be any one selected from the group consisting of Cr, Ti, Mo, Co, Ni, W, Al, Ag, Au, Cu, Fe, Mg and Pt, or alloys thereof.

The metal-dielectric thin layers may comprise the dielectric layer and the semi-transmissive metal layer, and the material of the dielectric layer may be any one selected from the group consisting of $SiOx$ ($x \geq 1$), $SiNx$ ($x \geq 1$), $MgF_2$, $CaF_2$, $Al_2O_3$, $SnO_2$, ITO, IZO, ZnO and $In_2O_3$, and the material of the semi-transmissive metal layer may be any one selected from the group consisting of Cr, Ti, Mo, Co, Ni, W, Al, Ag, Au and Cu.

A further aspect of the present invention provides a method of manufacturing a black organic light-emitting diode device comprising a glass substrate, a first metal layer formed on the glass substrate, a first electrode formed on the first metal layer, an organic light-emitting layer formed on the first electrode, and a second electrode formed on the organic light-emitting layer so as to face the first electrode, the method comprising forming a plurality of metal-dielectric thin layers on the second electrode so that external light reflected from the first metal layer and the second electrode destructively interferes.

According to the present invention, a black organic light-emitting diode device can reduce reflection of external light without the use of a circular polarizer, thus obviating additional processes, decreasing the thickness of the device and achieving an integrated device.

Also according to the present invention, problems of loss of light caused by the circular polarizer can be solved, thus effectively improving photoefficiency. Compared to a conventional organic light-emitting device having a circular polarizer, reflection of external light can be reduced without changes in reflectance of inner metal or in the thickness of a light-emitting layer and an electrode, and thus there are no influences on electrical properties or light emission efficiency of the device.

Also, unlike conventional techniques limited to bottom emission configurations, the present invention can be effectively applied to top emission configurations.

BRIEF DESCRIPTION OF THE DRAWINGS

FIGS. 14 and 15 are graphs illustrating the results of Example 1, in which FIG. 14 is a graph illustrating the external light reflectance depending on changes in the thickness of a phase matching layer (the thickness of Cr is set to 8 nm and the thickness of the phase compensation layer $SiO_2$ is set to 80 nm), and FIG. 15 is a graph illustrating the external light reflectance depending on changes in the thickness of the phase compensation layer (the thickness of Cr is set to 8 nm and the thickness of the phase matching layer is set to 60 nm);

FIGS. 16 and 17 are graphs illustrating the results of Example 1, in which FIG. 16 is a graph illustrating the external light reflectance depending on the thickness of Cr (the thickness of the phase matching layer is 60 nm and the thickness of the phase compensation layer is 80 nm), and FIG. 17 is a graph illustrating changes in light intensity depending on the thickness of Cr (the parenthesized numerals designate the efficiency ratio (luminance ratio) relative to a conventional organic light-emitting diode device having a circular polarizer);

FIGS. 18 and 19 are graphs illustrating the results of Example 2, in which FIG. 18 is a graph illustrating the external light reflectance depending on the thickness of a Mg:Ag electrode (the phase matching layer is 60 nm thick, the phase compensation layer is 80 nm thick and Cr is 6 nm thick), and FIG. 19 is a graph illustrating changes in light intensity depending on the thickness of the Mg:Ag electrode;

FIGS. 20 and 21 are graphs illustrating the results of Example 3, in which FIG. 20 is a graph illustrating the external light reflectance of a top emission light-emitting device depending on the thickness of phase matching layer (the thickness of Cr is 10 nm and the thickness of the phase compensation layer is 60 nm), and FIG. 21 is a graph illustrating changes in light intensity of the device depending on the thickness of phase matching layer;

FIGS. 22 and 23 are graphs illustrating the results of Example 4, in which FIG. 22 is a graph illustrating the external light reflectance of the device depending on the thickness of Ti (the thicknesses of the phase matching layer and the phase compensation layer are 80 nm), and FIG. 23 is a graph illustrating changes in light intensity of the device depending on the thickness of Ti;

FIGS. 24 and 25 are graphs illustrating the results of Example 5, in which FIG. 24 is a graph illustrating the external light reflectance of the device depending on the thickness of Ti (the thickness of the phase matching layer SiNx is 50 nm, and the thickness of the phase compensation layer $SiO_2$ is 70 nm), and FIG. 25 is a graph illustrating changes in light intensity of the device depending on the thickness of Ti; and FIGS. 26 and 27 are graphs illustrating the results of Example 6, in which FIG. 26 is a graph illustrating the external light reflectance of the device depending on the thickness of Mg:Ag (the thickness of the phase matching layer SiNx is 50 nm, the thickness of the phase compensation layer $SiO_2$ is 70 nm, and the thickness of the second metal layer Ti is 11 nm), and FIG. 27 is a graph illustrating changes in light intensity of the device depending on the thickness of Mg:Ag.

DETAILED DESCRIPTION OF THE INVENTION

Figure 1:
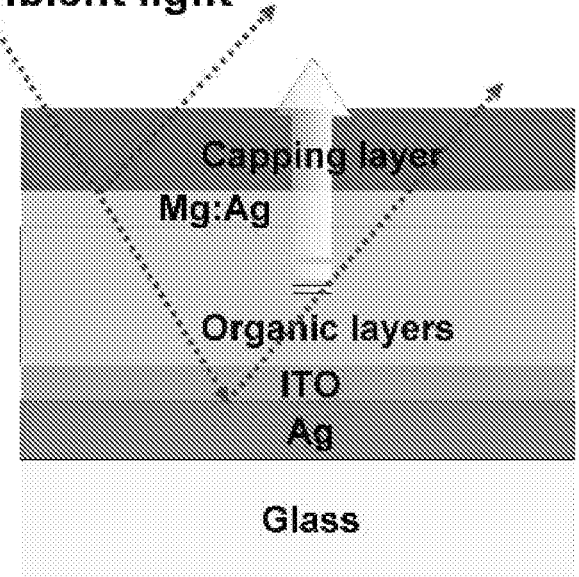
FIG. 1 is a schematic view illustrating a conventional top emission organic light-emitting diode.

Hereinafter, preferred embodiments of the present invention will be described in detail with reference to the accompanying drawings. Wherever possible, the same reference numerals will be used throughout the drawings and the description to refer to the same or like components. In the following description, it is to be noted that, when a detailed description of configurations or functions related to the present invention may make the gist of the present invention unclear, they will be omitted.

FIG. 1 is a schematic view illustrating a conventional top emission organic light-emitting diode.

As illustrated in FIG. 1, the conventional organic light-emitting diode comprises a glass substrate (glass), a reflective layer (Ag), a transparent electrode layer (ITO), an organic layer, a metal electrode layer (Mg:Ag) and a capping layer (or a passivation layer), which are sequentially disposed upwards. As illustrated in FIG. 1, external light is reflected from the metal electrode layer (Mg:Ag) and the reflective layer (Ag) and thus causes the contrast of the device to decrease.

Figure 2:
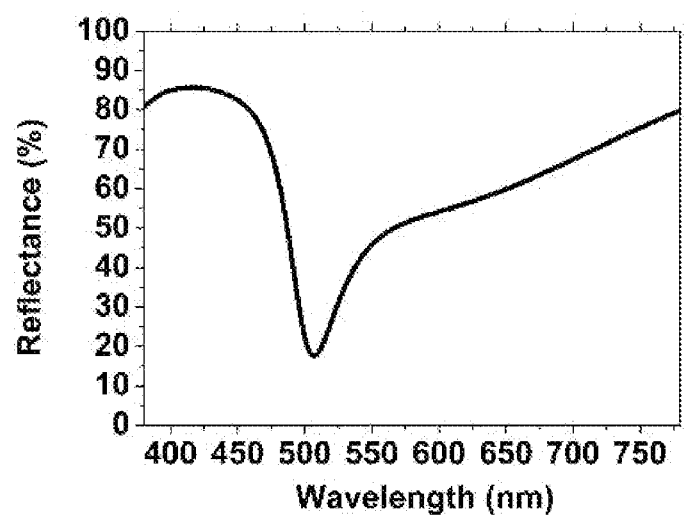
FIG. 2 is a graph illustrating the external light reflectance of a conventional top emission organic light-emitting diode device.

FIG. 2 is a graph illustrating the reflection of external light of a conventional top emission organic light-emitting diode device, and depicts the external light reflectance of the organic light-emitting diode device having the conventional top emission configuration of FIG. 1. In this case, luminous reflectance is about 45%.

Typically, the contrast of a display device is defined by the following Equation 1.

$$CR = \frac{L_{on} + R_D L_{ambient}}{L_{off} + R_D L_{ambient}} \quad \text{Equation 1}$$

Herein, Lon and Loff are luminance values upon turning the OLED device on and off, respectively. Lambient is the luminance of external light. RD is the luminous reflectance of a display defined by the following Equation 2, in which the luminous reflectance is the average reflectance of a display device in the visible light range.

$$R_D = \frac{\int_{\lambda 1}^{\lambda 2} V(\lambda) \cdot R(\lambda) \cdot S(\lambda) d\lambda}{\int_{\lambda 1}^{\lambda 2} V(\lambda) \cdot S(\lambda) d\lambda} \quad \text{Equation 2}$$

Herein, V is a luminous curve function, S is the spectrum of a standard light source D65, and R is the external light reflectance depending on the spectrum of the display. Thus, the luminous reflectance of external light of the conventional OLED device of FIG. 2 is about 45%.

Figure 3:
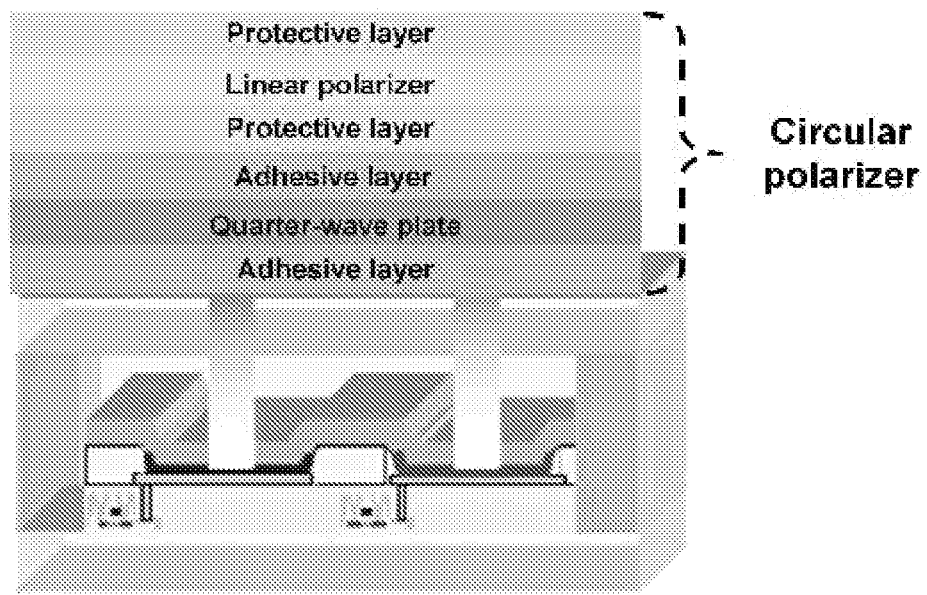
FIG. 3 is a schematic view illustrating a circular polarizer for reducing the reflection of external light.

To reduce such external light reflection, the conventional organic light-emitting device includes a circular polarizer as illustrated in FIG. 3 so that the reflection of external light is prevented and contrast is increased.

The circular polarizer illustrated in FIG. 3 comprises a plurality of optical thin layers composed mainly of a linear polarizer and a quarter-wave plate.

Figure 4:
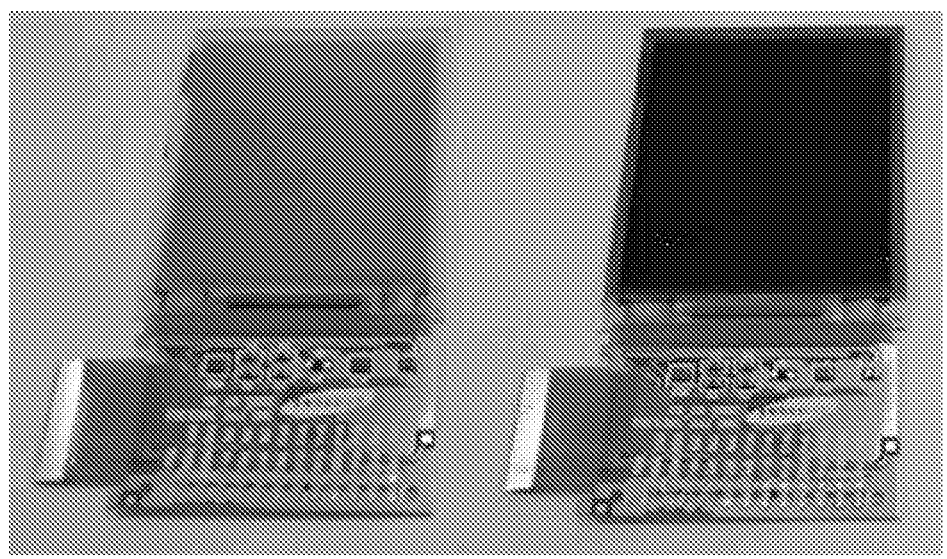
FIG. 4 is of photographs illustrating top emission OLEDs with and without a circular polarizer.

FIG. 4 illustrates the top emission OLEDs with and without a circular polarizer.

The left photograph illustrates an OLED device without a circular polarizer, and the right photograph illustrates an OLED device with a circular polarizer. When the OLED is configured without the use of the circular polarizer, it is difficult to use the OLED in the presence of strong external light such as external sunlight.

In the circular polarizer including a linear polarizer, the linear polarizer typically has a transmittance of about 40~45% and thus light which passes through the circular polarizer may be decreased by about 50% or more. Thus, when the circular polarizer is used, reflection of external light may be reduced, but light emitted from the inside of the device is undesirably absorbed and decreased. Consequently, the photoefficiency of the OLED device is lowered.

Also, a typical circular polarizer has a total thickness of about 0.3 mm. When this is applied to an ultrathin display, it may increase the thickness of the display and is disposed outside the device and thus requires an additional process, making it difficult to form an integrated single device. For this reason, many attempts have been made to remove the circular polarizer and to reduce the reflection of external light of the OLED device to improve contrast.

Figure 5:
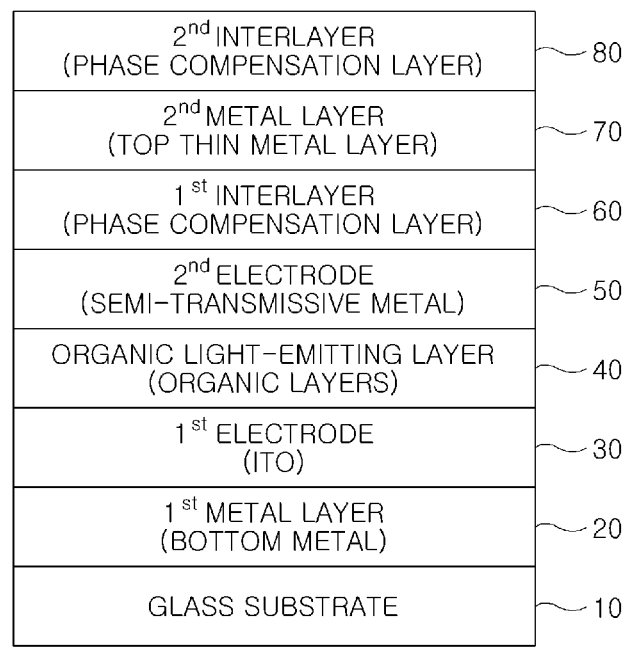
FIG. 5 is a view illustrating a black organic light-emitting diode device according to the present invention.

FIG. 5 is a schematic view illustrating a new type of black organic light-emitting diode device according to the present invention, in which reflection of external light may be reduced even without the use of a circular polarizer.

As illustrated in FIG. 5, the black organic light-emitting diode device according to the present invention comprises a glass substrate 10, a first metal layer 20, a first electrode 30, an organic light-emitting layer 40, a second electrode 50, a first interlayer 60, a second metal layer 70 and a second interlayer 80, which are sequentially disposed upwards, and in which the thickness of the first interlayer 60 and the second interlayer 80 is adjusted, whereby external light from the first metal layer 20 and the second electrode 50 destructively interferes with light reflected from the second metal layer 70, and light which does not destructively interfere is absorbed by the second metal layer 70. Thus, this is structured such that external light is absorbed using a resonant absorbing configuration.

The first metal layer 20 is a highly reflective layer and is preferably an Ag layer which improves electrical resistance of the first electrode 30 which is a transparent anode (ITO), and the material of the first metal layer 20 may be any one selected from the group consisting of Ag, Al, Mg, Cr, Ti, Ni, W, Au, Ta, Cu, Co, Fe, Mo and Pt, or alloys thereof.

The organic light-emitting layer 40 (organic layer) is formed on the first electrode 30, and the second electrode 50 is formed on the organic light-emitting layer 40 so as to face the first electrode 30. As such, the second electrode 50 is preferably a semi-transparent metal layer (Mg:Ag) which functions as a cathode.

The material of the second electrode 50 may be any one selected from the group consisting of Ag, Al, Mg, Cr, Ti, Ni, W, Au, Ta, Cu, Co, Fe and Pt, or alloys thereof.

Meanwhile the typical top emission OLED is configured such that light emitted from the organic layer passes through the semi-transparent Mg:Ag layer and is thus emitted to the outside, and a passivation layer is formed on the semi-transparent Mg:Ag layer to protect the electrode and the organic layer. The passivation layer is typically composed of an organic layer, and the configuration up to the passivation layer corresponds to the configuration of a typical top emission OLED.

In the present invention, the first interlayer 60 which is regarded as the passivation layer is used as a phase matching layer, and a second metal layer 70 which is a thin absorptive metal layer is formed thereon, and the second interlayer 80 which is a dielectric layer which compensates for the phase is formed thereon and is thus utilized as a phase compensation layer.

Thus, the thickness of the first interlayer 60 which functions as a phase matching layer and the thickness of the second interlayer 80 which functions as a phase compensation layer are adjusted so that external light reflected from the metal layers (in the present invention, the second electrode 50 and the first metal layer 20) in which reflection of external light mainly occurs in a typical top emission OLED device destructively interferes with light reflected from the second metal layer 70 which is additionally provided.

As such, the material of the second metal layer 70 (which is a top thin metal layer) is any one selected from the group consisting of Cr, Ti, Mo, Co, Ni, W, Al, Ag, Au, Cu, Fe, Mg and Pt, or alloys thereof.

The optical thickness of the phase matching layer and the phase compensation layer is designed to be near a ¼ wavelength although it varies depending on the distribution of an optical constant based on the kind of metal.

As such, light waves reflected from the metal layers cause destructive interference thus effectively reducing the reflection of external light. Accordingly, the present invention may advantageously reduce the reflection of external light even without the addition of a circular polarizer.

In the typical top emission OLED device, a layer by which the reflection of external light maximally occurs is the Mg:Ag layer corresponding to an upper electrode layer, from which about 60% or more of external light is reflected. Then, a second large amount of light is reflected from the lowest Ag layer and the remainder is reflected from respective interfaces. Thus, the reflection of external light may decrease in the whole visible light range using optical destructive interference and absorption of light by the metal layer. The optical destructive interference means that when light waves reflected from the interfaces form a phase of about 180° therebetween and have the same reflection amplitude, they are offset each other.

However, it is difficult to satisfy the optical destructive interference in the whole wavelength range, and part of light deviates from the destructive interference conditions and thus is not completely offset. Such light should be absorbed using a light absorbing material, which is regarded as very appropriate. Because metal is a light absorbing material, part of light may be absorbed when light passes through metal. Specifically, when the metal layer is used, part of reflected light may undergo destructive interference, and also using absorption caused upon passing through the metal layer, part of external light which is not completely offset due to destructive interference may be offset.

Meanwhile, the principle in which reflection of external light decreases using metal-dielectric thin layers is described well in "Journal of Korean Physical Society V. 55 p. 501". According to this literature, the second metal layer 70 of the black organic light-emitting diode device of the present invention illustrated in FIG. 5 is preferably formed of a highly absorptive metal. As mentioned above, it is difficult to satisfy the destructive interference conditions of light reflected from the second electrode 50 and light reflected from the second metal layer 70 in the whole wavelength range by adjusting the thickness of the first interlayer 60 serving as a phase matching layer and the second interlayer 80 as a phase compensation layer. Also, in the case of light reflected from the first metal layer 20 positioned below the second electrode 50, it is difficult to adjust the thickness of the organic light-emitting layer 40 positioned therebetween, making it more difficult to offset light using destructive interference.

Hence, the second metal layer 70 is very preferably made of a metal into which a large amount of light is absorbed while satisfying destructive interference conditions. Particularly useful is a metal having a refractive index and a coefficient of absorption of about 2~4.

Figure 6:
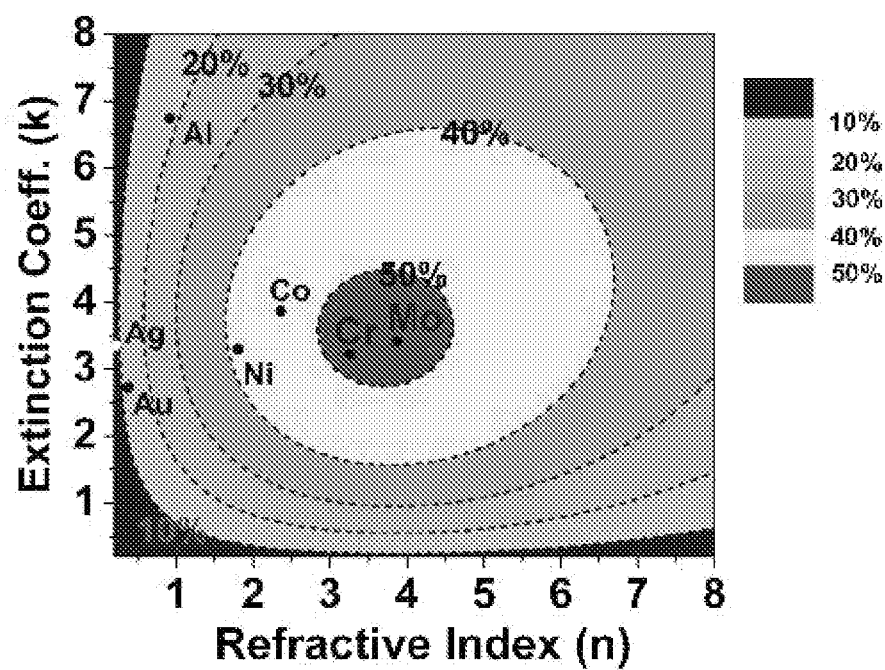
FIG. 6 is a graph illustrating the absorbance of any metal having a thickness of 10 nm.

FIG. 6 is a graph illustrating the absorbance of any metal having a thickness of 10 nm. As illustrated in FIG. 6, the second metal layer 70 is appropriately made of Cr, Mo, Ti, Co, Ni, W, etc. In the case of using such metal, the metal layer may effectively light in the whole visible light wavelength range because of destructive interference effects due to reflection and high absorbance, thus decreasing the reflection of external light.

The functions and materials of the first interlayer 60 which acts as the phase matching layer and the second interlayer 70 which acts as the phase compensation layer are described below.

The first interlayer 60 functions to adjust the relative phase between light reflected from the second electrode 50 (cathode) of the top emission OLED and light reflected from the second metal layer 70 to about 180°, and the material of the first interlayer 60 used as the phase matching layer is preferably any one selected from the group consisting of SiOx (x≧1), SiNx (x≧1), MgF$_2$, CaF$_2$, Al$_2$O$_3$, SnO$_2$, ITO, IZO, ZnO, Ta$_2$O$_5$, Nb$_2$O$_5$, HfO$_2$, TiO$_2$ and In$_2$O$_3$.

On the other hand, the phase difference of reflected light in the whole visible light wavelength is difficult to maintain at 180° using only the phase matching layer (the first interlayer 60) as mentioned above. Thus the phase compensation layer (the second interlayer 80) should be additionally inserted in order to compensate for the amount deviating from the phase of 180° depending on the wavelength of external light.

Figure 7:
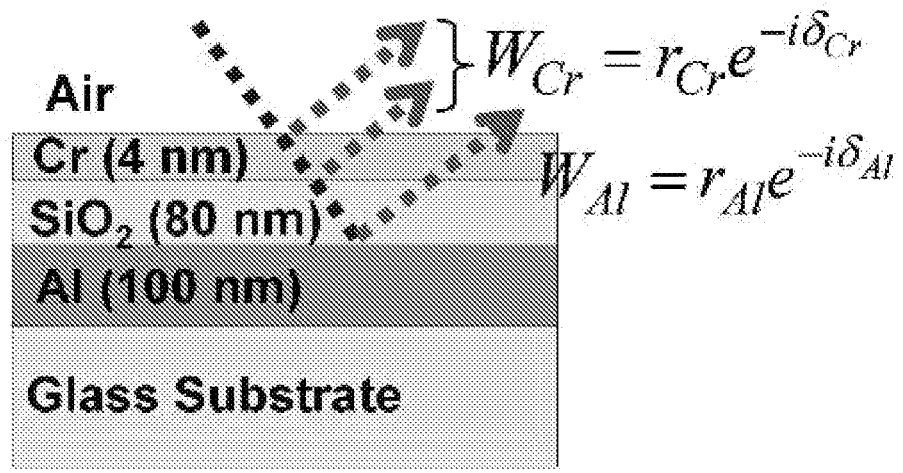
FIG. 7 is a view illustrating a metal-dielectric thin layer configuration having no phase compensation layer.
Figure 8:
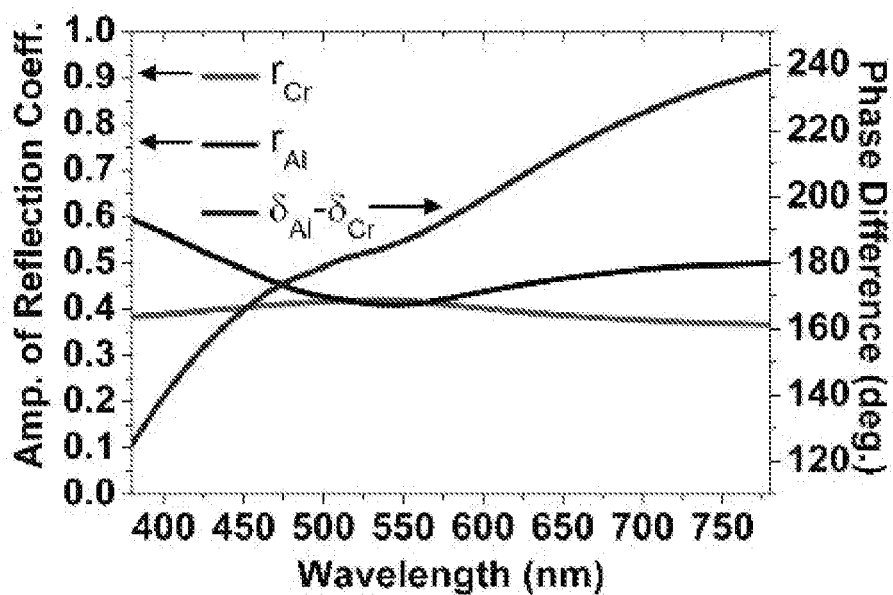
FIG. 8 is a graph illustrating the amplitude of the reflection coefficient and the phase difference at different wavelengths in the configuration of FIG. 7.
Figure 9:
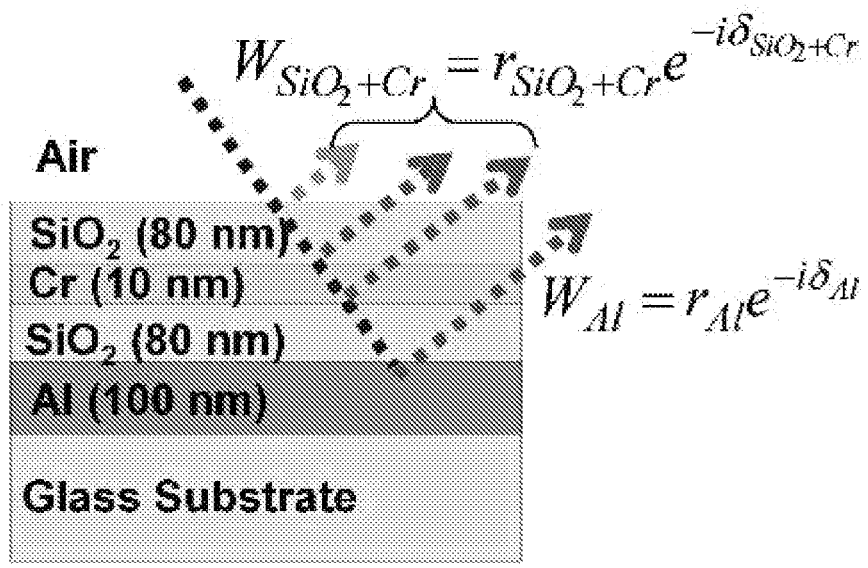
FIG. 9 is a view illustrating a metal-dielectric thin layer configuration having a phase compensation layer.
Figure 10:
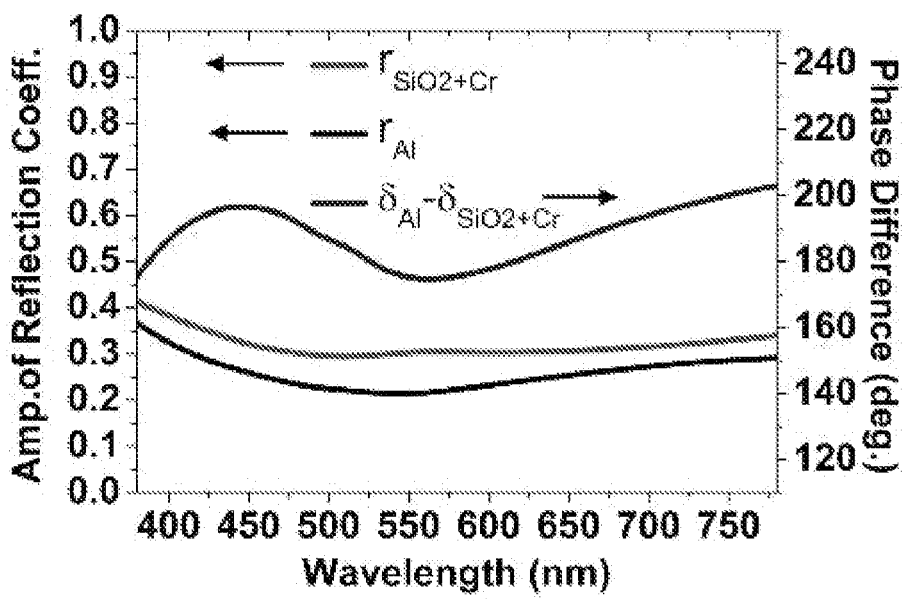
FIG. 10 is a graph illustrating the amplitude of the reflection coefficient and the phase difference at different wavelengths in the configuration of FIG. 9.
Figure 11:
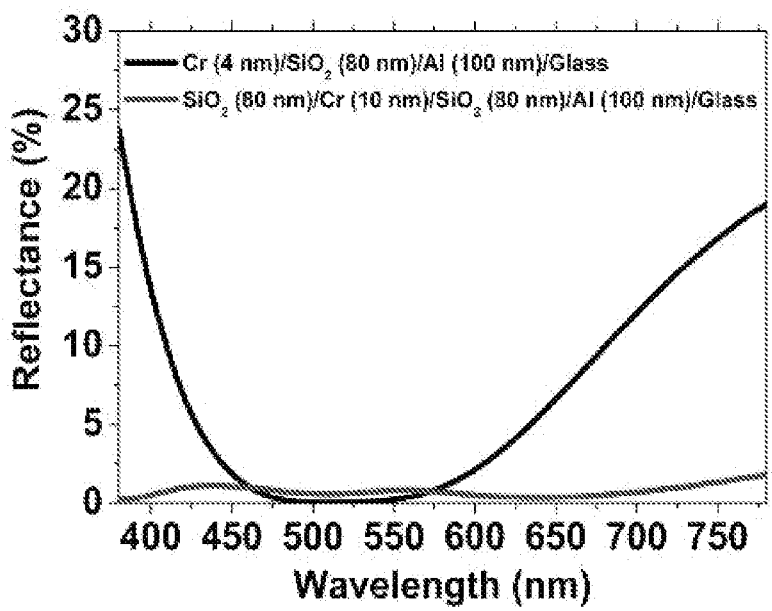
FIG. 11 is a graph illustrating the reflectance depending on whether the phase compensation layer is present or not.

FIGS. 7 to 12 illustrate the functions of the phase compensation layer. FIG. 7 illustrates a black metal-dielectric thin layer configuration comprising a phase matching layer and two metal layers without the addition of a phase compensation layer. In this case, as illustrated in FIG. 8, because the phase compensation layer is not provided, a phase difference of two light waves reflected from the upper metal layer and the lower metal layer is not maintained at 180° in the whole visible light range. In contrast, as illustrated in FIG. 9, in the case of a black film including the phase compensation layer, a phase difference is maintained at about 180° in the whole visible light range (FIG. 10). Thus, when the reflectance values of these two cases are compared, the case in which the phase compensation layer is provided is shown to have low reflectance in the whole visible light wavelength range (FIG. 11).

Also, the properties of dielectrics adapted for the first interlayer 60 as the phase matching layer and the second interlayer 80 as the phase compensation layer are described below. In most dielectrics, a refractive index decreases in proportion to an increase in wavelength, and this phenomenon has a negative influence on maintaining destructive interference in the whole wavelength range.

Accordingly, a dielectric in which changes in refractive index are low depending on changes in wavelength, namely, in which the distribution of an optical constant is low, is useful. Furthermore, because the incident medium is air (n=1), a dielectric material having a low refractive index is more suitably used for a phase compensation layer compared to using a dielectric material having a high refractive index.

Taking the above into consideration, the material of the second interlayer 80 used as the phase compensation layer is preferably any one selected from the group consisting of SiOx (x≧1), SiNx (x≧1), MgF$_2$, CaF$_2$, Al$_2$O$_3$, SnO$_2$, ITO, IZO, ZnO, Ta$_2$O$_5$, Nb$_2$O$_5$, HfO$_2$, TiO$_2$ and In$_2$O$_3$.

Figure 12:
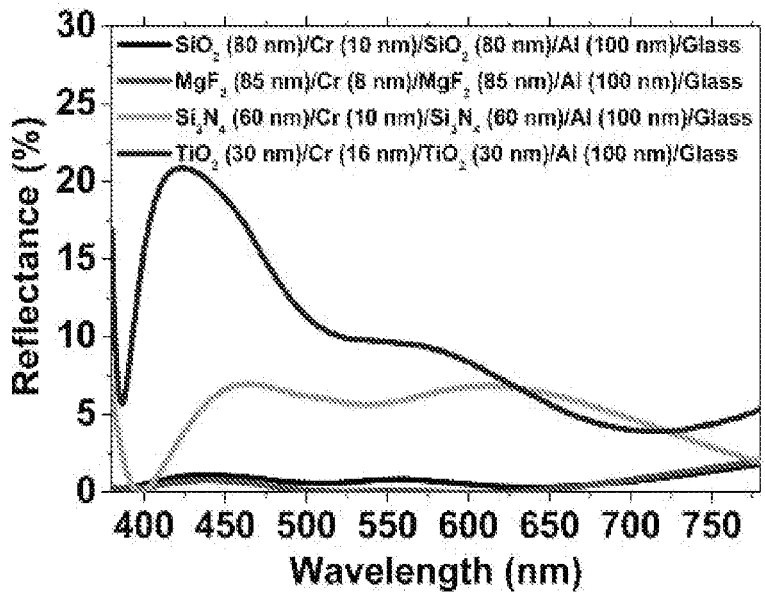
FIG. 12 is a graph illustrating the reflectance depending on the kind of material of phase compensation layer and phase matching layer.

FIG. 12 is a graph illustrating the reflective properties of black films using a variety of dielectric materials.

Figure 13:
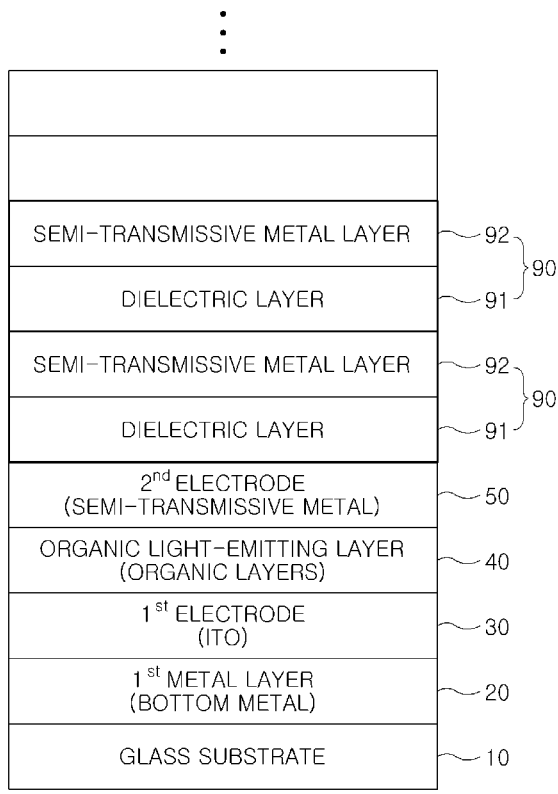
FIG. 13 is a view illustrating a black organic light-emitting diode device having a plurality of metal-dielectric thin layers.

In the present invention, a metal-dielectric thin layer configuration comprising a single phase matching layer (a first interlayer 60), a single absorptive metal layer (a second metal layer 70) and a phase compensation layer (a second interlayer 80) was actually used in place of a circular polarizer. More specifically, even when a plurality of metal-dielectric thin layers are used, they may function to reduce the reflection of external light as in the circular polarizer. Thus the configuration of the circular polarizer may be replaced with the configuration of the plurality of metal-dielectric thin layers of the present invention. FIG. 13 illustrates the OLED comprising a plurality of metal-dielectric thin layers.

A variety of examples of the black organic light-emitting diode device according to the present invention are described below.

Example 1

Cr was used as a second metal layer 70, and SiO$_2$ was used as both a phase matching layer (a first interlayer 60) and a phase compensation layer (a second interlayer 80). In the present invention, a transfer matrix type was adopted, which was adapted for reflection and transmission of a thin layer configuration. Such a transfer matrix type suitable for use in many optical coating and optical filter designs was described well in "Thin-Film Optical Filter, 3rd ed." by Macelod.

Figure 14:
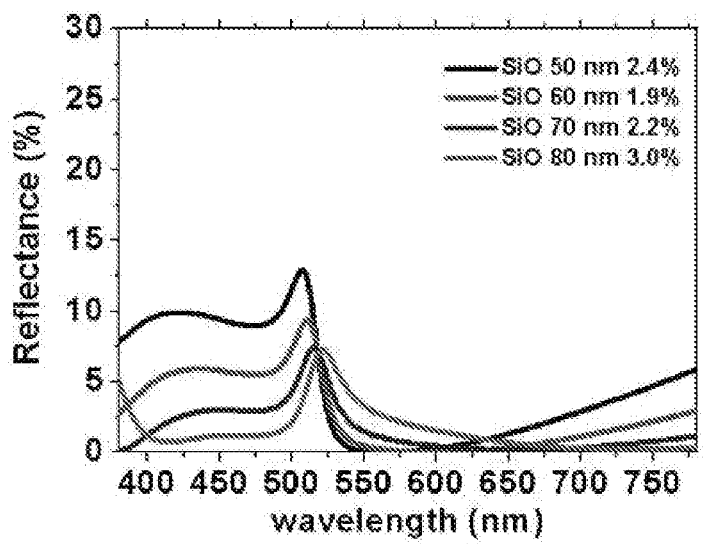
Figure 15:
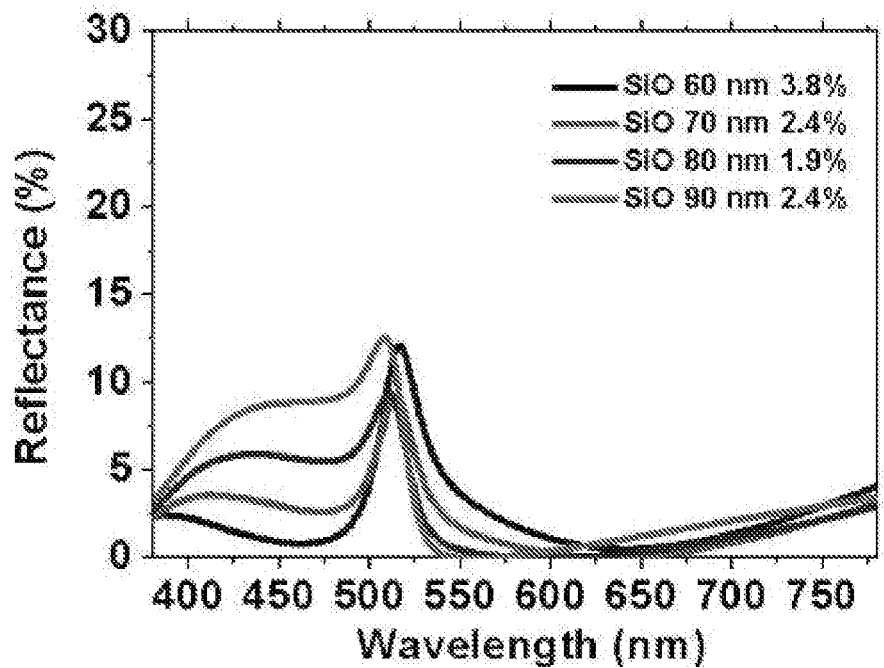
Figure 16:
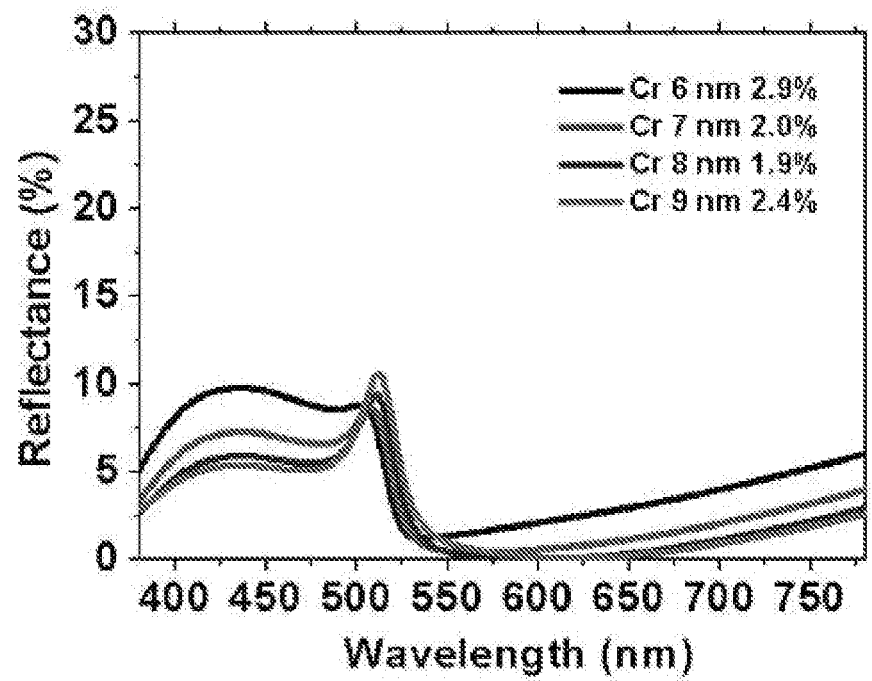
Figure 17:
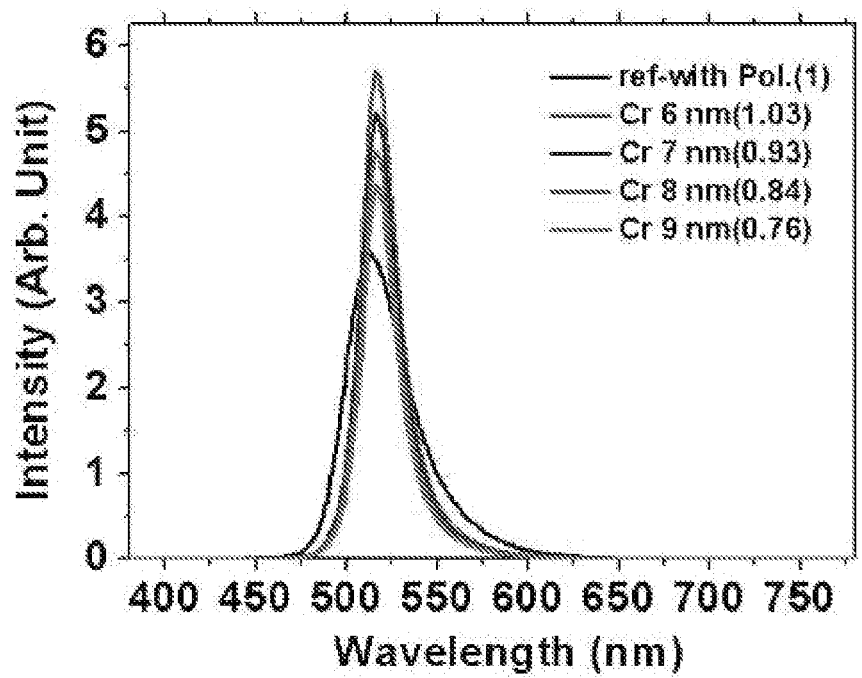

FIG. 9 illustrates the external light reflectance depending on changes in the thickness of the phase matching layer (the first interlayer 60) and the phase compensation layer (the second interlayer 80). FIG. 14 illustrates changes in reflection of external light depending on the thickness of the phase matching layer (the first interlayer 60). In the drawing, the parenthesized numerals indicate luminous reflectance values, and the smallest reflectance is obtained when SiO$_2$ is 60 nm. FIG. 15 illustrates the reflectance depending on the thickness of the phase compensation layer (the second interlayer 80). FIG. 16 illustrates the reflection of external light depending on changes in the thickness of Cr, and FIG. 15 illustrates the intensity depending on changes in the thickness of Cr, in which the parenthesized values indicate the luminance ratios relative to a conventional OLED device having a polarizer. Thus when the thickness of Cr is 6 nm, the efficiency is improved by about 3% compared to the conventional OLED. In this configuration, when the thickness of the phase compensation layer (the second interlayer 80) is 80 nm, the thickness of Cr is 6 nm and the thickness of the phase matching layer (the first interlayer 60) is 60 nm, the external light reflectance is about 2.9%, and the efficiency is improved by about 3% compared to the conventional OLED having a polarizer. All the following examples were conducted under conditions in which the thicknesses of the organic light-emitting layer 40 and the first electrode (ITO) 30 were the same as in the conventional OLED. Also, the thickness of the second electrode 50 was set to 18 nm which is the same as in the conventional OLED. In Examples 2 and 6, results depending on changes in thickness of the second electrode 50 were analyzed.

Example 2

When Cr was used as the second metal layer 70 and SiO$_2$ was used as the phase matching layer (the first interlayer 60)

and the phase compensation layer (the second interlayer 80), results depending on changes in thickness of the second electrode 50 using Mg:Ag were analyzed.

Figure 18:
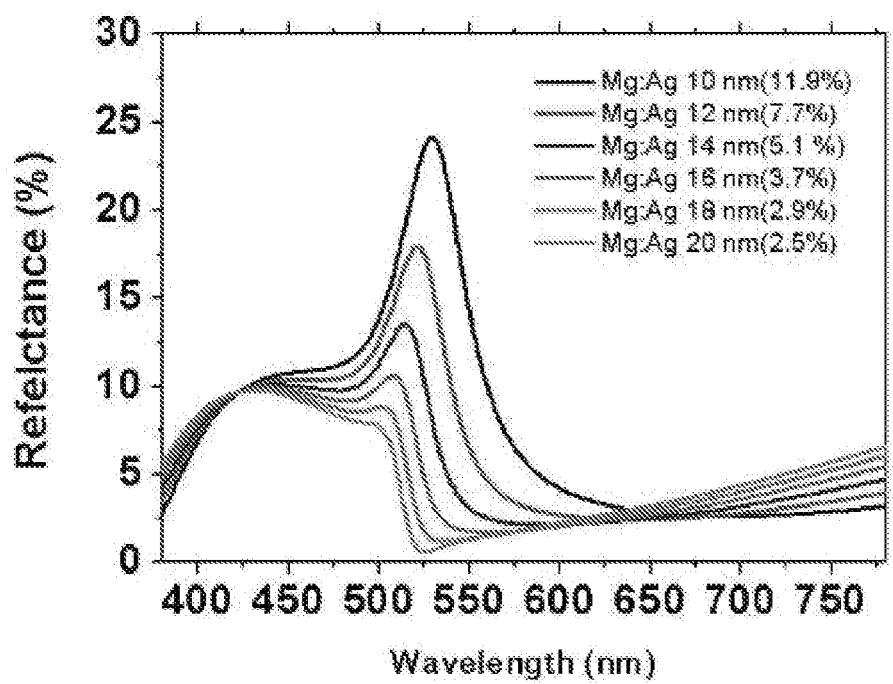
Figure 19:
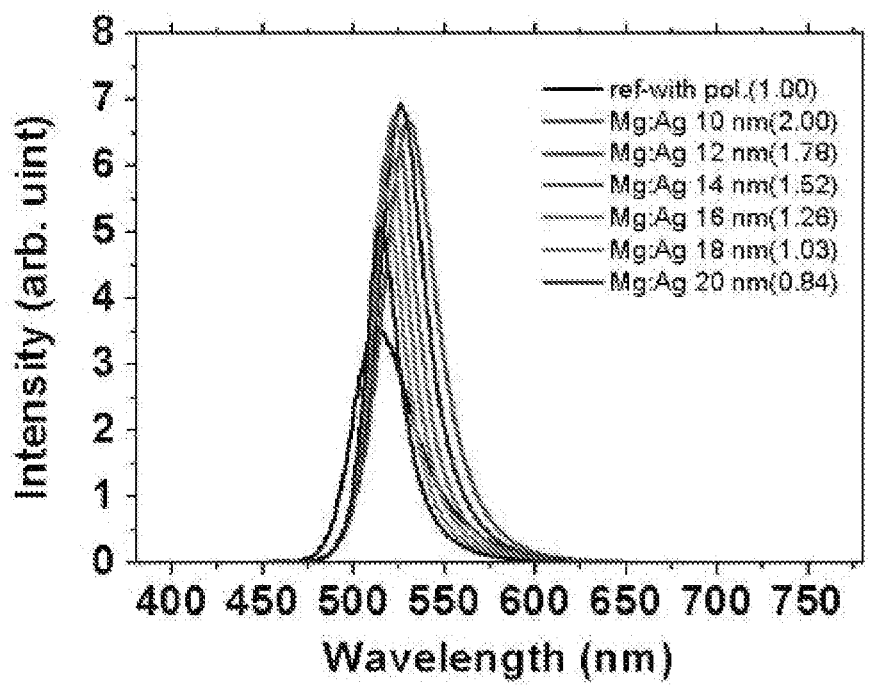

FIGS. 18 and 19 are graphs illustrating the external light reflectance and the efficiency depending on changes in the thickness of the second electrode 50. In Example 1, the thickness of the second electrode 50 was 18 nm which is the same as in the conventional OLED. As such, the external light reflectance was about 2.9%, and the efficiency was improved by about 3% compared to the conventional OLED.

However, as the thickness of Mg:Ag which is the second electrode 50 decreases, the efficiency is improved and the external light reflectance is increased. At about 16 nm, the external light reflectance is 3.7% and the efficiency is improved by about 26%.

The thickness of the Mg:Ag electrode can be seen to be adjusted in the range that does not affect electrical properties, so that the efficiency of reflection of external light can be controlled.

Example 3

Cr was used as a second metal layer 70, and SiNx was used as a phase compensation layer (a second interlayer 80) and a phase matching layer (a first interlayer 60).

Figure 20:
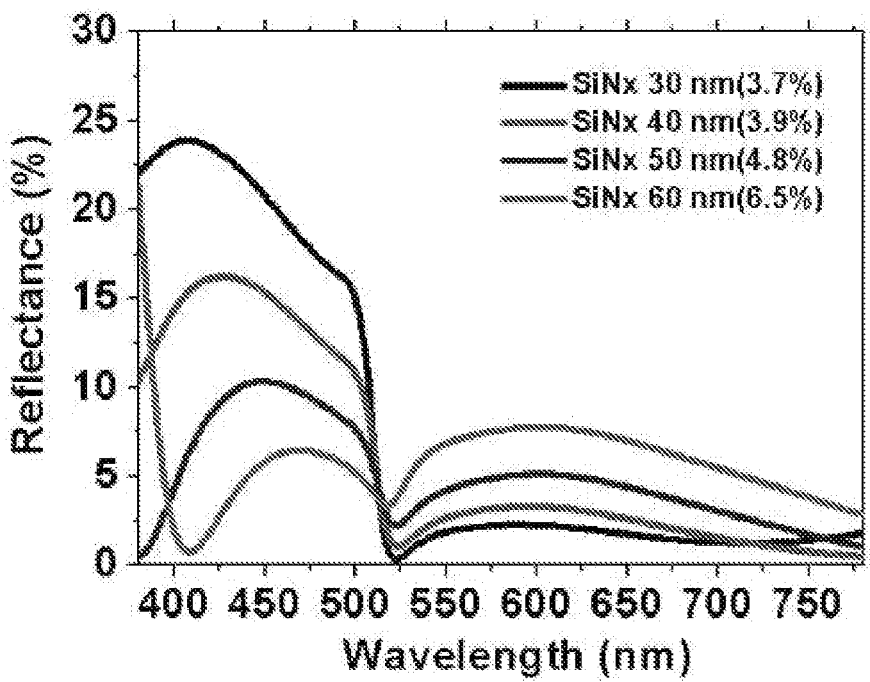
Figure 21:
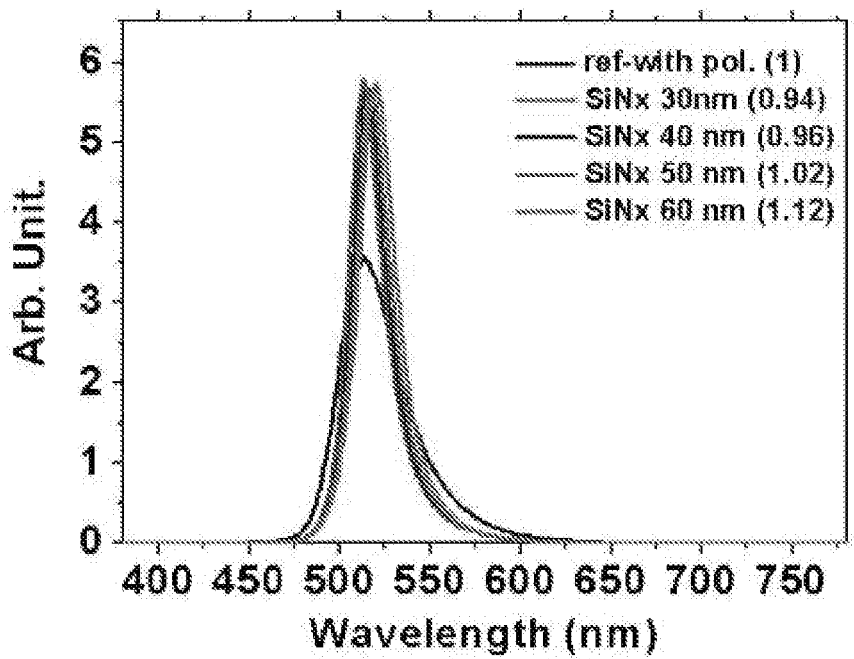

FIGS. 20 and 21 are graphs illustrating the external light reflectance and the efficiency when the thickness of the phase compensation layer (the second interlayer 80) made of SiNx is 60 nm and the thickness of Cr is 10 nm. For example, when the thickness of the phase matching layer (the first interlayer 60) is 50 nm, the external light reflectance is about 4.8%, and the efficiency is improved by about 2%.

Example 4

Ti was used as a second metal layer 70, and $SiO_2$ was used as a phase matching layer (a first interlayer 60) and a phase compensation layer (a second interlayer 80).

Figure 22:
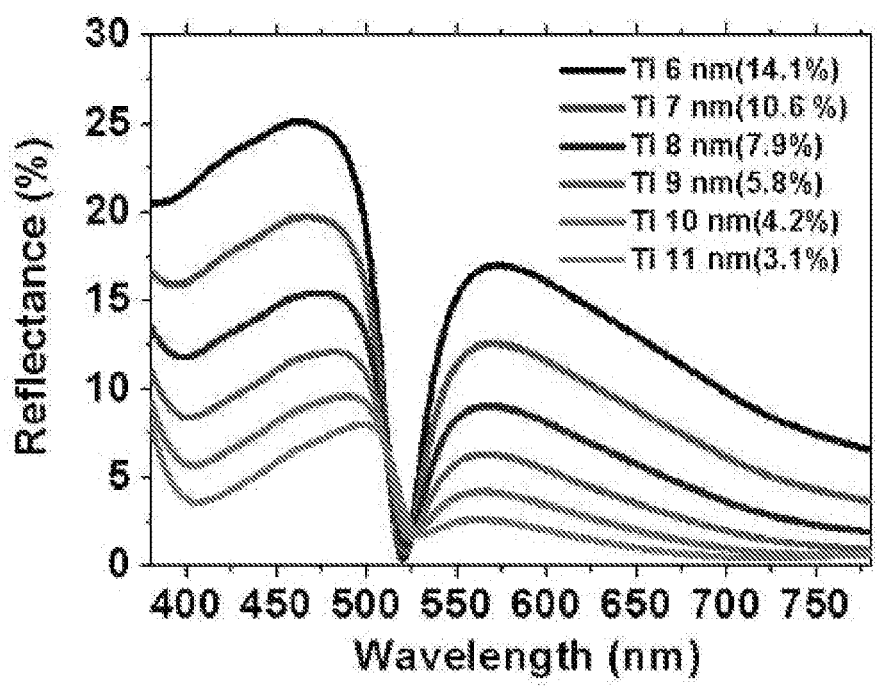
Figure 23:
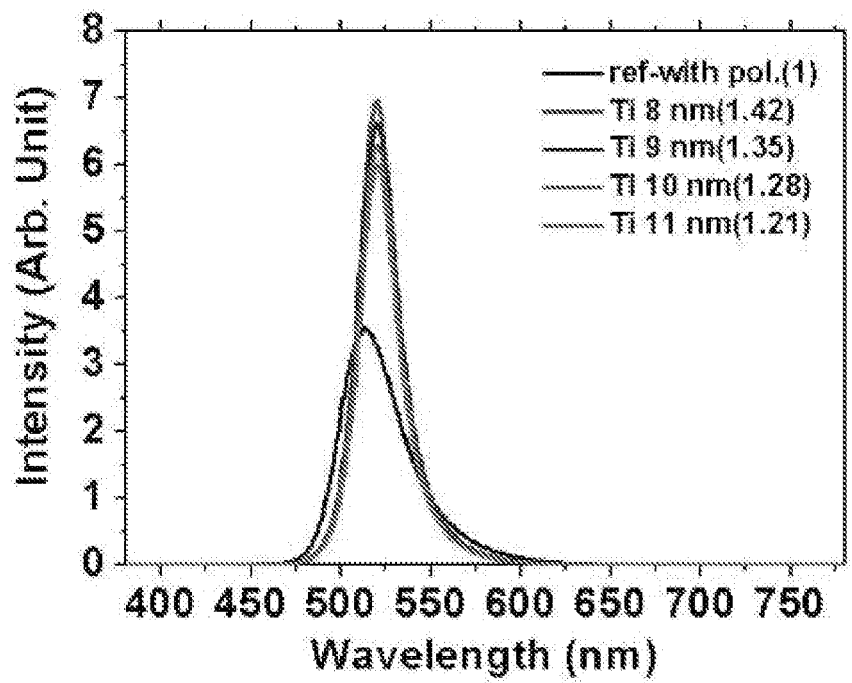

FIGS. 22 and 23 are graphs illustrating the external light reflectance and the intensity depending on the thickness of Ti which is the second metal layer 70 when the phase matching layer (the first interlayer 60) and the phase compensation layer (the second interlayer 80) are made of $SiO_2$ and have a thickness of 80 nm.

When the thickness of Ti is 10 nm, the external light reflectance is about 4.2%, and photoefficiency is improved by about 28% compared to a conventional OLED having a circular polarizer. Ti has lower absorbance than Cr thus exhibiting better efficiency.

Example 5

Ti was used as a second metal layer 70, SiNx was used as a phase matching layer (a first interlayer 60), and $SiO_2$ was used as a phase compensation layer (a second interlayer 80).

Figure 24:
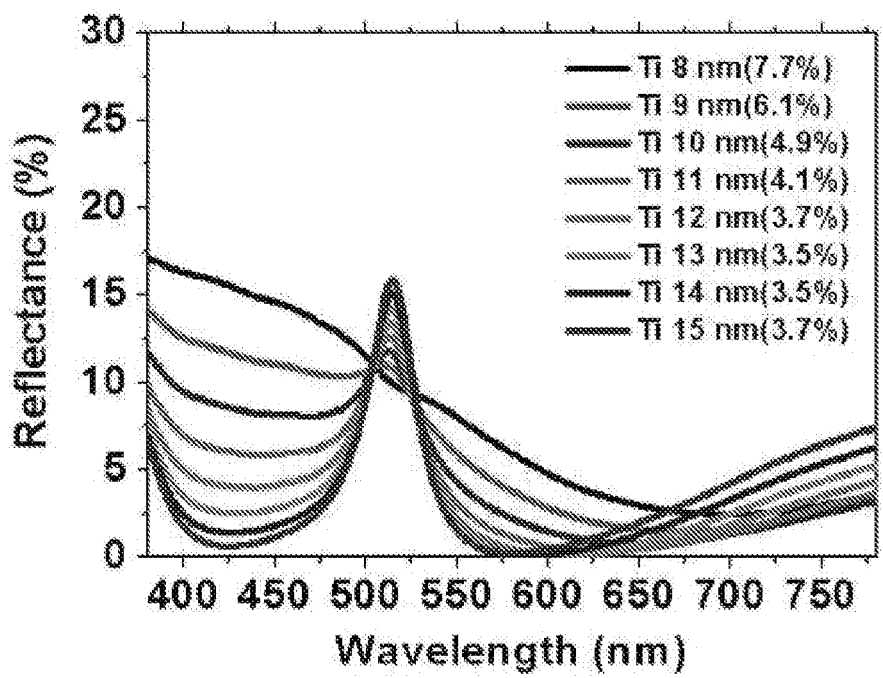
Figure 25:
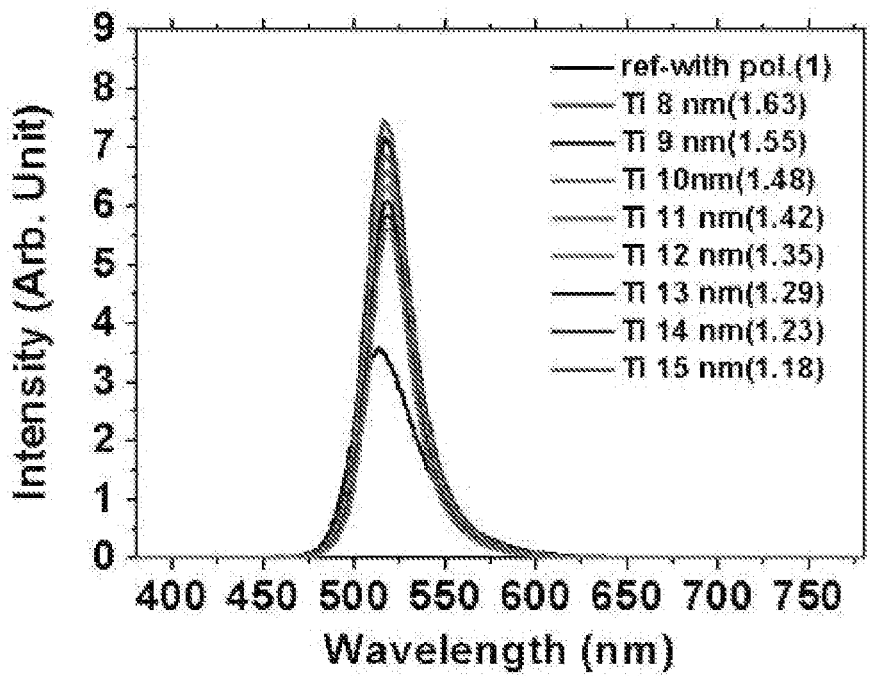

FIGS. 24 and 25 are graphs illustrating the efficiency of reflection of external light depending on changes in the thickness of Ti which is the second metal layer 70 when the phase compensation layer (the second interlayer 80) is made of $SiO_2$ and is 70 nm thick and the phase matching layer (the first interlayer 60) is made of SiNx and is 50 nm thick. When the thickness of Ti is 11 nm, the external light reflectance is about 4.1%, and photoefficiency is improved by about 42% compared to a normal OLED. The case of Example 5 exhibits the greatest performance.

Example 6

When Ti was used as the second metal layer 70, $SiO_2$ was used as the phase compensation layer (the second interlayer 80) and SiNx was used as the phase matching layer (the first interlayer 60), the greatest performance depending on the thickness of the second electrode (50) which was a semi-transmissive metal cathode (Mg:Ag) was exhibited in Example 5. In this case, the changes depending on the thickness of the second electrode 50 are investigated. Typically, a semi-transmissive metal cathode is an electron injection source of the OLED device and thus may greatly affect optical properties depending on the electrical properties, transmittance and reflectance thereof. Thus properties depending on typical changes in thickness were measured. As such, Ti was 11 nm thick, and the phase compensation layer (the second interlayer 80) was made of $SiO_2$ and was 70 nm thick, and the phase matching layer (the first interlayer 60) was made of SiNx and was 50 nm thick.

Figure 26:
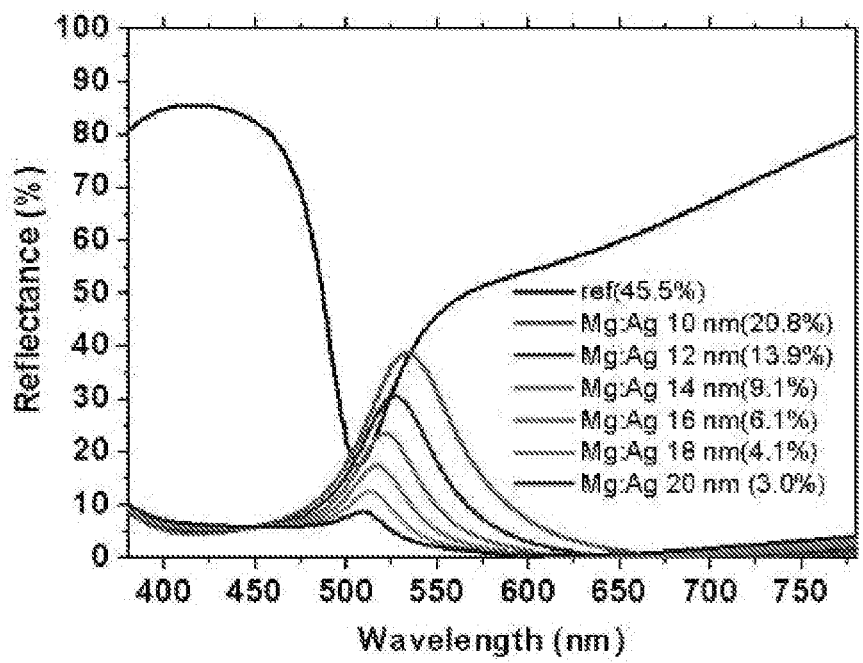
Figure 27:
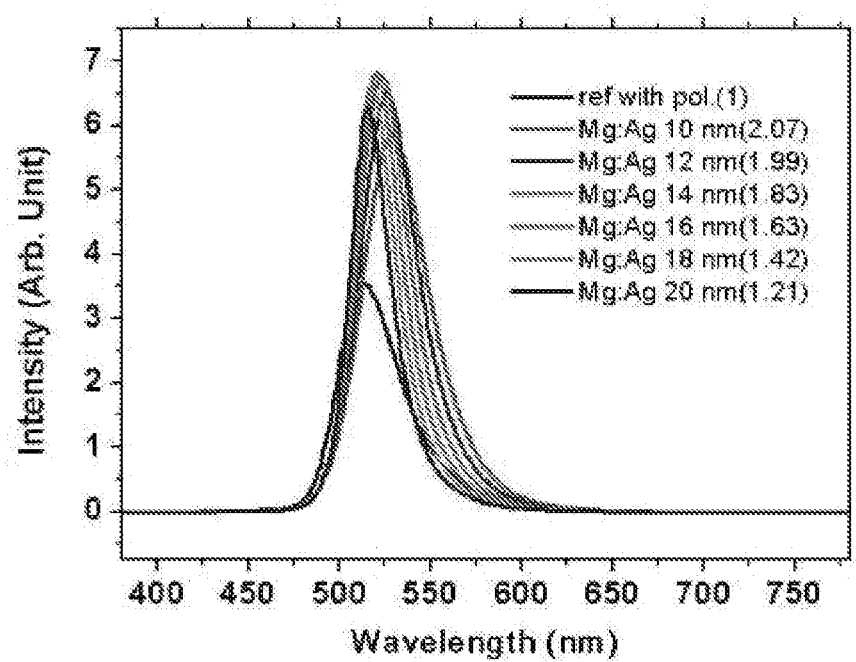

FIG. 26 is a graph illustrating the external light reflectance depending on the thickness of the second electrode 50, and FIG. 27 is a graph illustrating the efficiency depending on the thickness of the second electrode 50. When the thickness of the second electrode 50 made of Mg:Ag is 18 nm, the external light reflectance is 4.1% and the efficiency is improved by 42%, both of which are regarded as good.

Although the preferred embodiments of the present invention regarding the black organic light-emitting diode device have been disclosed for illustrative purposes, those skilled in the art will appreciate that various modifications, additions and substitutions are possible, without departing from the scope and spirit of the invention as disclosed in the accompanying claims.

What is claimed is:

1. A black organic light-emitting diode device, comprising:
a glass substrate;
a first metal layer formed on the glass substrate;
a first electrode formed on the first metal layer;
an organic light-emitting layer formed on the first electrode;
a second electrode formed on the organic light-emitting layer so as to face the first electrode;
a first interlayer formed on the second electrode;
a second metal layer formed on the first interlayer; and
a second interlayer formed on the second metal layer,
wherein thicknesses of the first interlayer and the second interlayer are adjusted so that external light reflected from the first metal layer and the second electrode destructively interferes with light reflected from the second metal layer.

2. The black organic light-emitting diode device of claim 1, wherein a part of the external light reflected from the first metal layer and the second electrode, which does not destructively interfere with light reflected from the second metal layer, is absorbed by the second metal layer.

3. The black organic light-emitting diode device of claim 2, wherein the first metal layer improves electrical resistance of the first electrode, and a material of the first metal layer is any one selected from the group consisting of Ag, Al, Mg, Cr, Ti, Ni, W, Au, Ta, Cu, Co, Fe, Mo and Pt, or alloys thereof.

4. The black organic light-emitting diode device of claim 2, wherein the second metal layer is provided in a form of a thin metal layer, and a material of the second metal layer is any one selected from the group consisting of Cr, Ti, Mo, Co, Ni, W, Al, Ag, Au, Cu, Fe, Mg and Pt, or alloys thereof.

5. The black organic light-emitting diode device of claim 2, wherein the first electrode is a transparent anode and comprises a transparent conductive oxide (ITO or IZO) or a semi-transmissive metal.

6. The black organic light-emitting diode device of claim 2, wherein the second electrode is a semi-transparent metal layer and forms a cathode, and a material of the second electrode is any one selected from the group consisting of Ag, Al, Mg, Cr, Ti, Ni, W, Au, Ta, Cu, Co, Fe, Mo and Pt, or alloys thereof.

7. The black organic light-emitting diode device of claim 2, wherein the first interlayer is a dielectric layer which enables a relative phase between light reflected from the second electrode and light reflected from the second metal layer to be adjusted to 120~240°, and a material of the first interlayer is any one selected from the group consisting of $SiO_x$ ($x \geq 1$), $SiN_x$ ($x \geq 1$), $MgF_2$, $CaF_2$, $Al_2O_3$, $SnO_2$, ITO, IZO, ZnO, $Ta_2O_5$, $Nb_2O_5$, $HfO_2$, $TiO_2$ and $In_2O_3$.

8. The black organic light-emitting diode device of claim 7, wherein the first interlayer is a dielectric layer which enables the relative phase between light reflected from the second electrode and light reflected from the second metal layer to be adjusted to 150~210°.

9. The black organic light-emitting diode device of claim 8, wherein the first interlayer is a dielectric layer which enables the relative phase between light reflected from the second electrode and light reflected from the second metal layer to be adjusted to 180°.

10. The black organic light-emitting diode device of claim 2, wherein the second interlayer is a dielectric layer which compensates for a case where the relative phase adjusted by the first interlayer falls outside 180°, and a material of the second interlayer is any one selected from the group consisting of $SiO_x$ ($x \geq 1$), $SiN_x$ ($x \geq 1$), $MgF_2$, $CaF_2$, $Al_2O_3$, $SnO_2$, ITO, IZO, ZnO, $Ta_2O_5$, $Nb_2O_5$, $HfO_2$, $TiO_2$ and $In_2O_3$.

* * * * *